United States Patent [19]
Fromson et al.

[11] Patent Number: 5,750,314
[45] Date of Patent: May 12, 1998

[54] METHOD FOR SELECTIVELY IMAGING A LITHOGRAPHIC PRINTING PLATE

[75] Inventors: Howard A. Fromson, P.O. Box 122, Stonington, Conn. 06378; Robert F. Gracia, Woodstock Valley; Steven A. Rubin, Glastonbury, both of Conn.

[73] Assignee: Howard A. Fromson, Stonington, Conn.

[21] Appl. No.: 567,690

[22] Filed: Dec. 5, 1995

[51] Int. Cl.$^6$ ..................................................... G03F 7/00
[52] U.S. Cl. .......................... 430/302; 430/144; 427/261; 427/511
[58] Field of Search ..................................... 430/144, 300, 430/302; 427/511, 261

[56] References Cited

U.S. PATENT DOCUMENTS

| | | | |
|---|---|---|---|
| 4,269,918 | 5/1981 | Nonogaki et al. | 430/144 |
| 5,534,380 | 7/1996 | Bodager et al. | 430/144 |

Primary Examiner—Christopher G. Young
Attorney, Agent, or Firm—Felfe & Lynch

[57] ABSTRACT

A substrate is coated with a first material which is soluble in a first solvent, whereupon a second material which is strongly adherent to the first material and insoluble in the first solvent is selectively applied by an ink jet printer. The substrate is then developed in the first solvent to establish the image. In a preferred embodiment the substrate is hydrophilic, the first material is a negative working photosensitive material, and the second material is a transparent adhesive, which permits curing the first material by exposure to actinic light after the development step. The adhesive is then removed. In an embodiment directed to a waterless plate the substrate includes a surface coating of silicone, and the first material is a primer which promotes adhesion of a second material in the form of an oleophilic adhesive which is selectively applied. The primer is then developed to expose the silicone on the non-image areas. The ink carrying image areas are formed by the adhesive, which in this embodiment is not removed.

27 Claims, 2 Drawing Sheets

METHOD FOR SELECTIVELY IMAGING A LITHOGRAPHIC PRINTING PLATE

BACKGROUND OF THE INVENTION

The invention relates to a method for selectively imaging a substrate, and more particularly to a method for using an ink jet printer to selectively image a lithographic printing plate provided with a negative working photosensitive coating.

To make a typical lithographic printing plate, a substrate is provided with a hydrophilic surface which is imaged with an oleophilic material corresponding to the pattern to be printed. The oleophilic material is typically a photosensitive photopolymer or diazo resin which is exposed to light by masking with a film negative. The exposed portions are rendered insoluble in a developer and the unexposed portions remain soluble. Insolubility is typically caused by cross-linking of the photopolymer, the rate of cross-linking enhanced by coating the photopolymer with an oxygen inhibition layer. After exposure the oxygen inhibition layer and the unexposed photopolymer are removed. Other negative working materials useful in this invention include diazo resins mixed with non-photosensitive polymers and resins.

The above described process is referred to as a negative working process because the unexposed material is removed. In a positive working process, the pattern to be printed is masked and the photosensitive exposed material is rendered soluble in a developer. Printing plates made according to either process are used on offset presses. These printing presses sequentially apply water and then ink to the plates. The inked plates then transfer a right reading image to a blanket cylinder producing a wrong reading image which is then transferred to paper right reading again.

Many variations in plate manufacturing processes using photopolymers, diazo resins, mixtures and various combinations are known. The plates generally have images that are planographic, i.e. substantially flat, but they may have raised images for relief printing or intaglio images for gravure printing. Lithographic printing processes may use water as described above or they may discriminate on waterless bases. If waterless, discrimination is achieved by having a finite difference in surface energies between image and non-image areas. Special inks are necessary for this process.

Presently, most offset printing plates are prepared by analog prepress techniques. Photo type-setters and conventional cameras containing silver halide paper and film generate positive texts and photographs which are eventually converted to film negatives for plate preparation. This process is labor intensive and costly. The computer has now made it possible to convert this prepress operation from an analog process to a digital process thus eliminating substantial labor and raw material costs. Total digitization of information also makes it possible to eliminate the film negative step in plate preparation and go directly to the plate. There are several means of digitally imagining a plate directly. Two of the most promising methods use laser or ink jet technology. Using laser to image plates directly is very costly because of the sophisticated optics and their controls. This is also a constraint with lasers because of the necessity for raster scanning. A further drawback to laser imaging is the need for expensive, high-speed plate coatings, most of which are commercially unproven. Ink jet printing technology is much simpler and more cost effective. No optical beam deflectors or focusing optics are necessary. Ink jet heads can be easily integrated so that imaging time is minimized. The coatings on the offset plates needed in an ink jet plate maker can be standard negative working photopolymers with proven track records. High sensitivity silver halide coatings are not necessary.

Ink jet printing technology has been used to prepare printing plates. Several patent processes are described in the literature. Each of these processes has fundamental problems that make it impractical for commercial use.

U.S. Pat. No. 4,003,312 was one of the first patents to recognize the advantages of using ink jet printing technology in a process for preparing a waterless lithographic printing plate. This patent discloses the use of an ink jet printing apparatus to deposit a background coating of silicons on an ink accepting substrate, the silicone being curable. This approach is not practical because the deposited silicone background coating must be cured at high temperatures.

U.S. Pat. No. 4,718,340 discloses a method for preparing a reusable planographic plate for lithography printing wherein a hydrophilic substrate is provided with a thin hydrophobic layer which is selectively removed. This process involves a multi step plate preparation using hydrophobic organic acids and derivatives thereof. The treated surfaces are then selectively imaged with a spark discharge, or laser ablation technique. This process has limited run length capability similar to other spark discharge and laser ablation techniques.

U.S. Pat. No. 4,833,486 discloses a similar process, albeit not for a reusable plates Here an ink jet printer is used to selectively image a hydrophilic surface with a hydrophobic true ink. The ink is hot and waxy so that it solidifies almost immediately on impact. The patent recognizes the problem of imperfections along the image edges and addresses this by applying the ink in a considerable thickness so that the marginal imperfections do not transfer ink. The process is thus a hybrid between lithography and letter press printing. Run lengths with such a system using "true" inks would be limited to several hundred at most. The image would wear rapidly through attrition and the imperfections in the jetted image would cause unacceptable images.

U.S. Pat. No. 5,312,654 discloses a method for making a printing plate wherein an ink absorbing layer is selectively imaged with a photopolymerizable composition using an ink jet printer. The ink absorbing layer prevents the ink from spreading and is removed after the ink is cured by exposure to actinic light, thereby exposing a hydrophilic surface where photopolymer has not been deposited. This process is impractical because the water soluble or alkali soluble coatings used as the ink absorbing layer have serious disadvantages since the ink jet imaged photopolymer sits on top of this layer. On a typical offset press, the use of an aqueous fountain solution would be disastrous for this plate. Additionally, the ink absorbing properties of this film limits control of dot or image formation and the resolution of fine details would still be problematic.

It is also possible to make a lithographic printing plate by using a mask in the form of an opaque material which is selectively applied according to one of several processes suitable for using an ink jet printer. According to one such method, a positive working surface, i.e. such as on a hydrophilic substrate of $AL_2O_3$, a positive working light sensitive material, is selectively imaged with an opaque material using an ink jet printer. The non-imaged areas are then exposed to actinic light to render them soluble, whereupon the non-imaged areas are developed to expose the hydrophilic surface. Such a method is disclosed in Canadian Patent No. 2,054,320 of Nippon Paint Co. A disadvantage is that positive working compounds must be applied to considerable thickness and require longer exposures as well as longer development time. Using an opaque aqueous ink-jet ink would also produce dot and image growth problems.

SUMMARY OF THE INVENTION

This invention relates to selective positive imaging of a suitable coated substrate. According to this inventive method, a surface of a substrate is coated with a continuous first layer of material which is soluble in a first solvent. The coating is then selectively imaged with a second material which is adhesive using an ink jet printing head. The second material is selected to be insoluble in the solvent for the first coating. Most conveniently the ink jet printing adhesive material is applied in a cylindrical or flat field format. It is important that the second material adhere well to the first coating. Following the selective application of the second material (the adhesive), the composite is developed in the first solvent, thus removing the first material from the non-image areas.

In this method of preparing a printing plate for a conventional lithographic process, the substrate is made hydrophilic. The first material is preferably a negative working photopolymer either with or without an oxygen inhibition layer. The second material, the imaging material, is a transparent adhesive. The transparent image adhesive allows actinic light to penetrate through to the negative working photopolymer. Development of the first material, the photopolymer, prior to exposure, is very advantageous. It provides maximum exposure latitude. The image can never be over-exposed, thus allowing for maximum curing or cross-linking of the photopolymer. The image can also be sharpened, if the need arises, by underexposure or overdevelopment. This phenomenon of underexposure or overdevelopment makes it possible to eliminate extraneous islands or satellites deposited during the high speed ink-jet imaging of the plate. In either case, the background has been removed prior to exposure thus eliminating any possibility of background contamination due to extraneous light or mishandling by the operator. The second material, the transparent adhesive, can be removed, if desired, by a suitable solvent or by washing in hot water. This results in a selective image of the first material which conforms to the exact footprint of the second adhesive material as applied by the ink jet. Alternatively, the second material may be removed after development but prior to exposure, or may not be removed at all.

Another advantage of this method of the invention, is that hydrophilic substrates such as anodized post-treated aluminum, as well as the negative photosensitive materials and developers therefor are already well established, time-proven, products in wide use in the printing industry.

The inventive method of manufacture employs a negative working light-sensitive coating on grained anodized post-treatment aluminum substrate. The coating weight is typically between 25 and 150 mg/ft$^2$, preferably between 75 and 100 mg/ft$^2$.

If additive diazo resins are used, the coat weight can be much less—5–15 mg/ft$^2$.

To manufacture a dryographic or waterless lithographic printing plate version of the method of this invention, the substrate includes a layer of silicone rubber, which is the low energy surface material intended to act as a non-image surface. On this silicone layer is a first material which is a thin layer of primer which promotes adhesion of a second adhesive material. The second material which becomes the image is laid down by an ink-jet head. This selectively applied adhesive has a surface energy much higher than the silicone surface of the substrate. When the primer, or first material, is removed by a solvent to expose the silicone, a dry planographic printing plate results. The selectively applied adhesive remains to form the ink accepting image areas. Because its surface energy is so much higher than the silicone layer, suitable inks are attracted to the adhesives and repelled by the silicone.

DETAILED DESCRIPTION OF THE PREFERRED EMBODIMENTS

Figure 1:
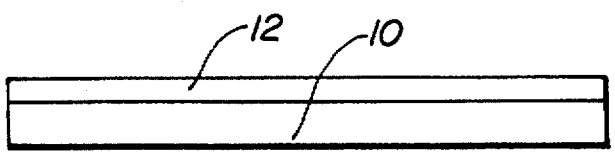
FIG. 1 illustrates a conventional printing plate provided with a light sensitive negative working coating.

FIG. 1 shows a substrate 10 coated with a first material which is preferably a negative working photopolymer layer 12 to a thickness of about 2–5 microns. The substrate 10 is aluminum having a grained and anodized hydrophilic surface.

Figure 2:
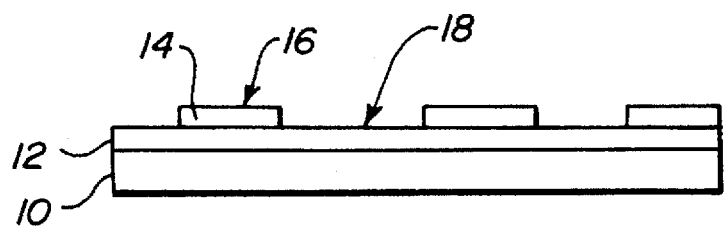
FIG. 2 illustrates the plate of FIG. 1 with ink jetted adhesive material.

FIG. 2 shows a second adhesive material 14, which is preferably a transparent phase change compound such as a hot-melt adhesive selectively applied to the anodized photopolymer surface to produce imaged areas 16 and non-imaged areas 18. This is preferably done with an ink jet printer incorporating a moving print head emitting the phase-change compound as a pulsed stream of droplets. The compound is heated to maintain it at a suitable viscosity during emission. It solidifies on contact with the plate surface. Alternatively, a second adhesive material prepared as a low viscosity liquid may be applied using a continuous flow type head.

Figure 3:
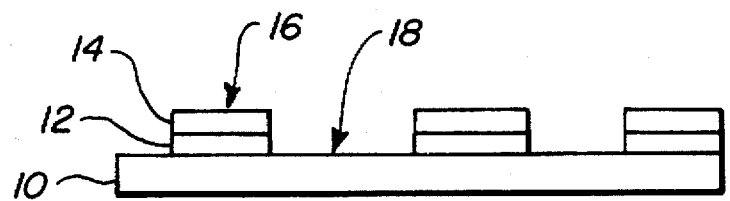
FIG. 3 illustrates the plate after the negative working coating is developed.

In FIG. 3 the negative working coating 12 has been removed from the background 18 with the first solvent thus exposing the hydrophilic surface, the first solvent being a developer for the photopolymer coating 12. The transparent adhesive 14 and the underlying photopolymer coating 12 remain undisturbed.

Figure 3A:
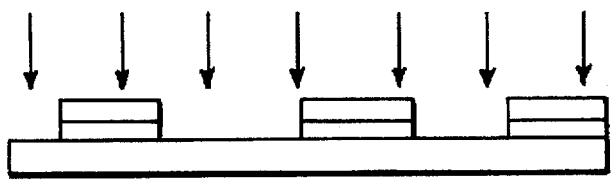
FIG. 3A illustrates the exposure to actinic light.

FIG. 3A illustrates the exposure after development of the residual imaged photopolymer 12 to ultraviolet light. The light passes through the transparent adhesive 14 to cross-link the photopolymer 12 in the image.

Figure 4:
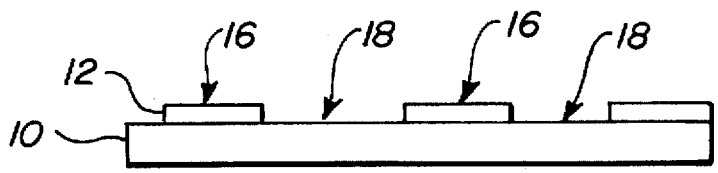
FIG. 4 illustrates the finished printing plate after removal of the adhesive material.

As a final step (FIG. 4), the adhesive is removed by washing in a second solvent which does not attack the cross-linked photopolymer. The offset printing plate imaged with a cross-linked photopolymer is now ready for the press. The imaged plate prepared in this way is capable of printing over 200,000 impressions.

The invention also contemplates embodiments wherein the first material 12 is not a photopolymer, but is a non-photosensitive polymer or resin coating soluble in a first solvent and insoluble in a second solvent. The second adhesive material 14 need not be transparent, but must be insoluble in the first solvent and soluble in a second solvent. The first material 12 is now imaged with an ink jet printer containing a suitable adhesive material from the background. The first material in the non-imaged areas 18 is next removed using a first solvent. The second adhesive material protects the underlying first material in the imaged areas 16. The intermediate step of exposing to actinic light is not necessary, because the first material is not photosensitive. The adhesive material may now be removed with a second solvent. The offset plate prepared in this way is now ready for press.

In an example according to these embodiments the first material is an epoxy, urethane, or cellulose, and the second material is a hot-melt adhesive or an adherent wax which is soluble in hot water but not soluble in the solvent for the first material.

The invention further contemplates a process for manufacturing a waterless printing plate wherein the second (adhesive) material is not removed. This process is illustrated in FIGS. 5, 6, and 7.

Figure 5:
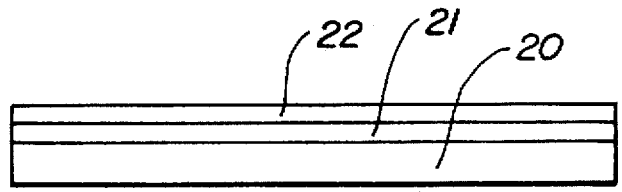
FIG. 5 illustrates a composite substrate suitable for manufacturing a waterless plate.

FIG. 5 illustrates a substrate including a plate 20 coated with a silicone polymer 21. A thin coating of primer 22 is provided on top of the silicone 21 to promote adherence of an ink jet adhesive.

Figure 6:
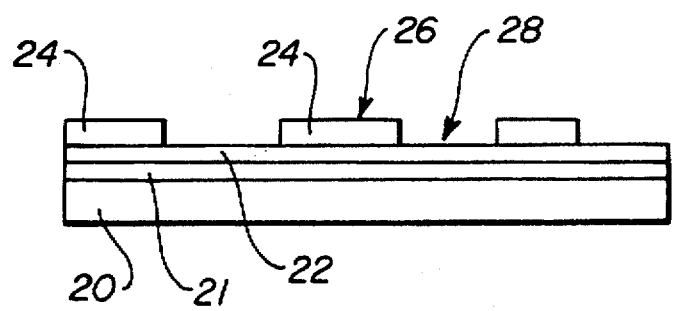
FIG. 6 illustrates selective application of adhesive to the plate of FIG. 5.

FIG. 6 illustrates the selectively applied ink jet adhesive 24 which produces imaged areas 26 and non-imaged areas 28. The adhesive 24 which adheres to the primer 22 is a cyanoacrylate which is applied with an ink jet printer.

Figure 7:
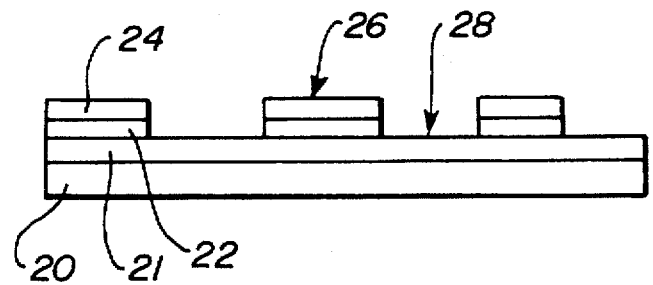
FIG. 7 illustrates a finished waterless printing plate.

FIG. 7 illustrates the finished waterless plate after the primer 22 in the non-imaged areas 28 has been removed by a solvent to expose the silicone 21 in the non-imaged areas.

The adhesives useful in this invention must have the following properties:

a) They must be fluid enough at the time of application to wet the surface of a particular film or substrate completely. In order to achieve good wetting and bonding, the adhesive of choice must have low viscosity at the moment of application.

b) The adhesive must set and develop enough cohesive strength and bonding strength to withstand wet development of non-image areas and protect the underlying image areas. This development may take place in an automatic processor or by hand. The developers may be solvent based, water based or a solvent/water mix. The choice of developer will depend on the type of ink jet adhesive in a particular head and the type of adherent (film) to be imaged.

There are three types of adhesives useful in this invention:

1) Solvent release types: This class would include solutions of resins and emulsions or latices.

2) Phase change adhesives: This class would include all thermoplastic and hot melt materials.

3) Reactive adhesives: This class would include condensation polymers and addition polymers.

Typical adhesive precursors useful in ink jet adhesives would include the follows: Synthetic Resins (polyvinyl acetate, polyvinyl butynal, PCV, acrylics, cyano acrlates, phenolformaldyde); Synthetic Rubbers (SBR, nitrile rubber, neoprene, butyl rubber, silicone); Low Molecular Weight Resins (resins, resin esters, polyterpenes, petroleum resins); Natural Polymers (starch, dextrin, wheat flour, soya flour, animal glue, casein, natural rubber); and Inorganic (sodium silicate).

Typically a formulated adhesive may contain solvents, plasticizers, waxes, fillers, tackifyers, curing agents and catalysts.

The list of precursors and additives is not meant to be inclusive. There are many more materials that may be used in these adhesives.

It is important to emphasize that whichever adhesive (the ink jet adhesive) or adherent (film) pair is selected for a particular ink jet platemaking application, the qualifying test is to machine or hand process with a developer for that adherent (film). It qualifies if the resulting imagery is totally resolved with no loss of image in the smallest detail areas.

EXAMPLE 1

A brush grained, anodized silicated aluminum substrate used for offset printing was coated with a negative working photopolymer coating. The coated product was imaged with a transparent hot melt adhesive from Stanley-Parker Inc. The imaged plate had fine lines and spots over the entire surface of the plate. The spots and lines were applied with a hot melt adhesive gun to simulate an ink jet printing head. The imaged plate was processed in a Technigraph plate processor containing two high speed rotary brushes. The developer was an aqueous product containing benzyl alcohol made by Anocoil Corporation. After processing the plate was examined for loss of imagery. There was no loss of even the smallest detail. The adhesion of the hot melt was so good that no loss of detail was experienced until after the plate was passed through the processor five times. The plate was subsequently exposed to actinic light.

EXAMPLE 2

A brush grained plate similar to Example 1 was coated with a non light sensitive coating containing polyvinyl alcohol and a red water soluble dye. The coated plate was imaged as in Example 1 and hand developed with water. After development with water, it was observed that all of the fine detail remained securely bonded to the red polyvinyl alcohol coating protected by the applied adhesive.

EXAMPLE 3

A brush grained plate such as the one used in Example 1 was coated with a silicone coating, RTV Ultra Blue from Loctite. The silicone coated plate was primed with a coating of 770 Primer from Loctite. The thus coated and primed plate was imaged dropwise with a syringe to simulate an ink jet head containing a cyano acrylate adhesive from Loctite. The imaged plate was rubbed with waterless ink from Flint Ink, Inc. The ink picked up readily in the image areas and did not pick up in the background showing good discrimination.

EXAMPLE 4

A negative working photopolymer plate made by Anocoil Corporation was imaged digitally with a phase change ink jet head made by Spectra, Inc. The imaged plate was then processed multiple times in a Technigraph processor. The phase change ink used in this test adhered to the photopolymer film very well. The plate was processed four times before the loss of any image detail was observed, qualifying this phase change ink material of Spectra's as a good adhesive for this process.

The foregoing is exemplary and not intended to limit the scope of the claims which follow.

What is claimed is:

1. Method for selectively imaging a planographic substrate, said method comprising the following serial steps:

coating one surface of a substrate with a first material which is soluble in a first solvent without being exposed to actinic light, selectively applying a second material in a desired image array on said coating of said first material on said substrate, thereby producing imaged areas and non-imaged areas, said second material adhering to said first material on said imaged areas and being insoluble in said first solvent without being exposed to actinic light, and dissolving the first material on said non-imaged areas in said first solvent, thereby removing said first material to expose said surface of said substrate in said non-imaged areas.

2. Method as in claim 1 wherein said first material is oleophilic and said substrate is hydrophilic, said method comprising the additional step of removing said second material from said imaged areas while leaving said first material thereunder intact.

3. Method as in claim 2 wherein said first material is a negative working photosensitive material which is cured when exposed to actinic light, said second material being transparent to said actinic light, said method comprising the additional step of exposing said imaged areas to actinic light subsequent to development in said first solvent, thereby curing the first material in said imaged areas.

4. Method as in claim 1 wherein said second material is soluble in a second solvent in which said first material is not soluble, said second material being removed by washing said imaged areas in said second solvent.

5. Method as in claim 1 wherein said second material is oleophilic and said exposed surface of said substrate is oleophobic, whereby said plate is suitable for waterless lithography.

6. Method as in claim 5 wherein said substrate comprises a layer of silicone resin forming said one surface.

7. Method as in claim 5 wherein said second material is a cyanoacrylate adhesive.

8. Method as in claim 7 wherein said first material is a primer for said cyanoacrylate adhesive.

9. Method as in claim 8 wherein said first material is an amine which is applied to said substrate in a heptane carrier.

10. Method as in claim 5 wherein said second material is applied with an ink jet print head to a thickness of less than 5 microns.

11. Method as in claim 1 wherein said first material is not photosensitive.

12. Method as in claim 1 wherein said second material is opaque.

13. Method as in claim 1 wherein said second material is not removed.

14. Method as in claim 1 wherein said second material is a solvent release adhesive.

15. Method as in claim 1 wherein said second material is selectively applied using an ink jet printing head.

16. Method of manufacturing a lithographic printing plate, said method comprising the following serial steps:

providing a substrate having a hydrophilic surface, coating said substrate with a negative working photosensitive material which is soluble in a developer, selectively imaging said negative working photosensitive material with a transparent adhesive material which is insoluble in said developer without being exposed to actinic light and which adheres to said negative working photosensitive material, thereby producing imaged areas of non-imaged areas, washing said imaged areas and said non-imaged areas with said developer to remove said non-imaged areas.

exposing said imaged areas to actinic light which renders said imaged areas of said negative working photosensitive material insoluble, and removing said adhesive material from said imaged areas.

17. Method as in claim 16 wherein said negative working photosensitive material is a photopolymer.

18. Method as in claim 16 wherein said negative working photosensitive material is a diazo resin.

19. Method as in claim 16 wherein said adhesive material is selectively applied by an ink jet print head.

20. Method as in claim 16 wherein said adhesive material is a phase change material.

21. Method as in claim 20 wherein said phase change material is a hot melt adhesive.

22. Method as in claim 20 wherein said phase change material is removed by washing in hot water.

23. Method as in claim 16 wherein said adhesive material is a curable adhesive.

24. Method as in claim 16 wherein said adhesive material is a polymerizable adhesive.

25. Method as in claim 16 wherein said adhesive material is a solvent releasable adhesive.

26. Method as in claim 16 wherein said adhesive material is not removed.

27. Method as in claim 16 wherein said negative working photosensitive material is rendered oleophilic by exposing said imaged areas to actinic light.

* * * * *